United States Patent
Tang et al.

(10) Patent No.: US 11,815,564 B2
(45) Date of Patent: Nov. 14, 2023

(54) METHOD FOR ANALYZING CORRELATION BETWEEN RAIL TRANSIT AND DIRECT CURRENT (DC) MAGNETIC BIAS OF TRANSFORMER

(71) Applicants: State Grid Hubei Electric Power Research Institute, Hubei (CN); State Grid Hubei Wuhan Electric Power Supply Company, Hubei (CN); Wuhan Power Supply Design Institute Co., Ltd., Hubei (CN); State Grid Hubei Electric Power Co., Ltd., Hubei (CN); China Railway Siyuan Survey and Design Group Co., Ltd., Hubei (CN); Wuhan Xindian Electric Co., Ltd., Hubei (CN); Shenzhen Metro Construction Group Co., Ltd., Guangdong (CN)

(72) Inventors: Zeyang Tang, Hubei (CN); Ling Ruan, Hubei (CN); Yong Yao, Hubei (CN); Jian Wang, Hubei (CN); Shuang Chen, Hubei (CN); Chao Cai, Hubei (CN); Zhi Tian, Hubei (CN); Lingxiao Gao, Hubei (CN); Xiaoxun Deng, Hubei (CN); Zhichun Yang, Hubei (CN); Ling Qiu, Hubei (CN); Zhou Ge, Guangdong (CN)

(73) Assignees: State Grid Hubei Electric Power Research Institute, Wuhan (CN); State Grid Hubei Wuhan Electric Power Supply Company, Wuhan (CN); Wuhan Power Supply Design Institute Co., Ltd., Wuhan (CN); State Grid Hubei Electric Power Co., Ltd., Wuhan (CN); China Railway Siyuan Survey and Design Group Co., Ltd., Wuhan (CN); Wuhan Xindian Electric Co., Ltd., Wuhan (CN); Shenzhen Metro Construction Group Co., Ltd., Shenzhen (CN)

( * ) Notice: Subject to any disclaimer, the term of this patent is extended or adjusted under 35 U.S.C. 154(b) by 297 days.

(21) Appl. No.: 17/598,269

(22) PCT Filed: Aug. 11, 2021

(86) PCT No.: PCT/CN2021/111970
§ 371 (c)(1),
(2) Date: Sep. 26, 2021

(87) PCT Pub. No.: WO2022/083242
PCT Pub. Date: Apr. 28, 2022

(65) Prior Publication Data
US 2022/0317205 A1    Oct. 6, 2022

(30) Foreign Application Priority Data

Oct. 25, 2020    (CN) .......................... 202011151504.5

(51) Int. Cl.
*G01R 31/00*    (2006.01)
*G01R 31/62*    (2020.01)
*G01R 19/00*    (2006.01)

(52) U.S. Cl.
CPC ......... *G01R 31/62* (2020.01); *G01R 19/0092* (2013.01)

(58) Field of Classification Search
USPC .............................................. 324/547, 117 R
See application file for complete search history.

(56) References Cited

U.S. PATENT DOCUMENTS

2017/0003329 A1*    1/2017    Basu ................... G01R 19/28

FOREIGN PATENT DOCUMENTS

| CN | 102520373 A | 6/2012 |
|----|-------------|--------|
| CN | 106291164 A | 1/2017 |
| CN | 108256234 A | 7/2018 |

* cited by examiner

*Primary Examiner* — Vincent Q Nguyen

(57) ABSTRACT

A method for analyzing a correlation between rail transit and direct current (DC) magnetic bias of a transformer includes the steps of, A: obtaining a current of a feed cable and a DC magnetic bias current: measuring the feed cable current in (Continued)

rail transit and the DC magnetic bias current of a transformer in a power grid within a certain period by a monitoring apparatus; B: calculating a characteristic quantity of the feed current within the measurement period based on the obtained current of the feed cable; C: calculating a characteristic quantity of the DC magnetic bias current within the measurement period based on the DC magnetic bias current; and D: calculating a support degree and a confidence coefficient based on the calculated characteristic quantity of the feed current and the calculated characteristic quantity of the DC magnetic bias current, and generating a correlation rule.

4 Claims, 1 Drawing Sheet

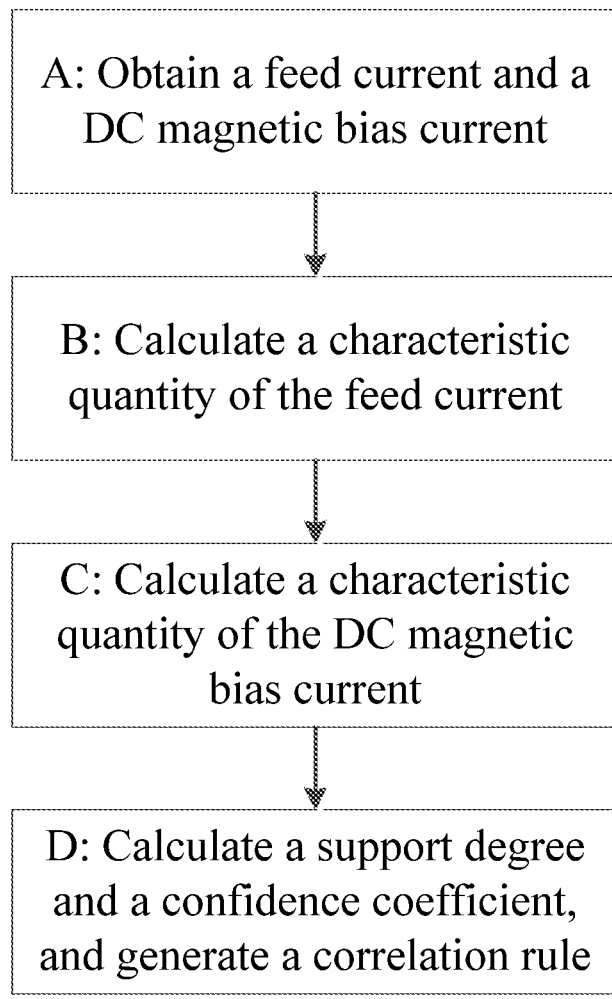

METHOD FOR ANALYZING CORRELATION BETWEEN RAIL TRANSIT AND DIRECT CURRENT (DC) MAGNETIC BIAS OF TRANSFORMER

TECHNICAL FIELD

The present disclosure relates to the technical field of rail transit and direct current (DC) magnetic bias of transformers, and specifically, to a method for analyzing a correlation between rail transit and DC magnetic bias of a transformer.

BACKGROUND

A DC current is used as a traction power source of rail transit, and the traction DC current is large, up to thousands of amperes. Because a rail transit track is not completely insulated from the ground, a part of the traction DC current does not return to a negative terminal of the power source along a return rail, which is referred to as a stray current. When a neutral point of a transformer in a power grid is directly grounded, the stray current may flow into the neutral point of the transformer in the power grid, causing DC magnetic bias to the transformer and affecting normal operation of the transformer. To analyze a correlation between the stray current in rail transit and a DC magnetic bias current of the transformer, it is necessary to analyze a correlation between a feed current in rail transit and the DC magnetic bias current.

The Chinese invention patent "a method and system for determining a DC magnetic biasing state of a transformer through noise detection" with application No. 201610583685.6 determines the DC magnetic biasing state of the transformer by detecting noise of the transformer. The Chinese invention patent "a method for determining DC magnetic bias of a power transformer based on vibration analysis" with application No. 201110432033. X determines, by detecting a vibration signal, whether DC magnetic bias occurs in the transformer. The above two invention patents only relate to detection and analysis of relevant parameters on a power grid side, and do not involve analysis of relevant parameters on a rail transit side. The Chinese invention patent "a method and system for evaluating impact of DC magnetic bias of a transformer" with application No. 201810052427.4 calculates, by calculating an impact probability of a stray current of a subway on magnetic bias of a pre-divided transformer substation in a power grid, a risk of each transformer substation affected by DC magnetic bias, and evaluates a DC current at a neutral point of a monitoring site based on a correlation rule of monitoring data. The invention patent correlatively analyzes factors such as a subway operation period, a season, and a climate, and does not analyze the correlation between the feed current in rail transit and the DC magnetic bias current.

SUMMARY

To overcome the shortcomings in the prior art, the present disclosure provides a method for analyzing a correlation between rail transit and DC magnetic bias of a transformer. The correlation analysis method provided in the present disclosure can provide a basis for analyzing impact of rail transit on DC magnetic bias of a transformer in a power grid.

The present disclosure adopts the following technical solution.

A method for analyzing a correlation between rail transit and DC magnetic bias of a transformer includes the following steps:

A: obtaining a current of a feed cable and a DC magnetic bias current: measuring the current of the feed cable in rail transit and the DC magnetic bias current of a transformer in a power grid within a certain period by a monitoring apparatus;

B: calculating a characteristic quantity of the feed current within the measurement period based on the obtained current of the feed cable in step A;

C: calculating a characteristic quantity of the DC magnetic bias current within the measurement period based on the DC magnetic bias current obtained in step A; and D: calculating a support degree and a confidence coefficient based on the calculated characteristic quantity of the feed current in step B and the calculated characteristic quantity of the DC magnetic bias current in step C, and generating a correlation rule.

Further, in step B, the calculating a characteristic quantity of the feed current within the measurement period based on the obtained current of the feed cable in step A specifically includes:

assuming that there are a total of N subway stations, the measurement period is T, one measurement point is recorded every one second, a feed current of an $i^{th}$ subway station $DT_i$ at a time point t is $IF_{i,t}$, and a feed current threshold is $IF_{i,iv}$; and if $IF_{i,t} \leq IF_{i,iv}$, determining that a value of a characteristic quantity $CF_{i,t}$ of the feed current of the subway station $DT_i$ at the time point t is 0, where $1 \leq i \leq N$ and $1 \leq t \leq T$; or if $IF_{i,t} \geq IF_{i,iv}$, determining that a value of a characteristic quantity $CF_{i,t}$ of the feed current of the subway station $DT_i$ at the time point t is 1, where $1 \leq i \leq N$ and $1 \leq t \leq T$.

Further, in step C, the calculating a characteristic quantity of the DC magnetic bias current within the measurement period based on the DC magnetic bias current obtained in step A specifically includes:

assuming that there are a total of M transformer substations, the measurement period is T, one measurement point is recorded every one second, a DC magnetic bias current of a $j^{th}$ transformer substation $BD_j$ at the time point t is $IS_{j,t}$, and a DC magnetic bias current threshold is $IS_{j,iv}$; and if $IS_{j,t} < IS_{j,iv}$, determining that a value of a characteristic quantity $CS_{j,t}$ of the DC magnetic bias current of the transformer substation $BD_j$ at the time point t is 0, where $1 \leq j \leq M$ and $1 \leq t \leq T$; or if $IS_{j,t} \geq IS_{j,iv}$, determining that a value of a characteristic quantity $CS_{j,t}$ of the DC magnetic bias current of the transformer substation $BD_j$ at the time point t is 1, where $1 \leq j \leq M$ and $1 \leq t \leq T$.

Further, in step D, the calculating a support degree and a confidence coefficient based on the calculated characteristic quantity of the feed current in step B and the calculated characteristic quantity of the DC magnetic bias current in step C, and generating a correlation rule specifically includes:

generating an item set $P = \{p_1, p_2, \ldots, p_T\}$ within the measurement period T based on the calculated characteristic quantities of the feed current and the DC magnetic bias current, where each second corresponds to one item; there are a total of T items in the item set P; the item only includes a subway station and a transformer substation whose characteristic quantities are 1; and the time point t is used as an example, and if characteristic quantities of all the N subway stations and M transformer substations at the time point are 1, an item $p_t$ corresponding to the time point t shall include the N subway stations and the M transformer substations;

obtaining, from the item set and based on an Aprior algorithm, a frequent item set whose support degree and confidence coefficient are both greater than 80%; and generating a rule for a strong correlation between a subway station and a transformer substation based on the obtained frequent item set, and analyzing a correlation between the feed current in rail transit and the DC magnetic bias current of the transformer.

The present disclosure provides a method for analyzing a correlation between rail transit and DC magnetic bias of a transformer. A correlation is quantized based on a support degree and a confidence coefficient, to provide a basis for analyzing impact of rail transit on DC magnetic bias of a transformer in a power grid.

BRIEF DESCRIPTION OF THE DRAWINGS

FIG. 1 is a schematic flowchart of an embodiment of a method for analyzing a correlation between rail transit and DC magnetic bias of a transformer according to the present disclosure.

DETAILED DESCRIPTION

The technical solutions in the present disclosure are clearly and completely described below with reference to the accompanying drawings in the present disclosure.

FIG. 1 is a schematic flowchart of an embodiment of a method for analyzing a correlation between rail transit and DC magnetic bias of a transformer according to the present disclosure. The method includes the following steps:

A: Obtain a current of a feed cable and a DC magnetic bias current: measure the current of the feed cable in rail transit and the DC magnetic bias current of a transformer in a power grid within a certain period by a monitoring apparatus (for example, a clamp ammeter).

B: Calculate a characteristic quantity of the feed current within the measurement period based on the obtained current of the feed cable in step A. This step specifically includes:

assuming that there are a total of N subway stations, the measurement period is T, one measurement point is recorded every one second, a feed current of an $i^{th}$ subway station $DT_i$ at a time point t is $IF_{i,t}$, and a feed current threshold $IF_{i,tv}$; and if $IF_{i,t} < IF_{i,tv}$, determining that a value of a characteristic quantity $CF_{i,t}$ of the feed current of the subway station $DT_i$ at the time point t is 0, where $1 \le i \le N$ and $1 \le t \le T$; or if $IF_{i,t} \ge IF_{i,tv}$, determining that a value of a characteristic quantity $CF_{i,t}$ of the feed current of the subway station $DT_i$ at the time point t is 1, where $1 \le i \le N$ and $1 \le t \le T$.

C: Calculate a characteristic quantity of the DC magnetic bias current within the measurement period based on the DC magnetic bias current obtained in step A. This step specifically includes:

assuming that there are a total of M transformer substations, the measurement period is one measurement point is recorded every one second, a DC magnetic bias current of a $j^{th}$ transformer substation $BD_j$ at the time point t is $IS_{j,t}$, and a DC magnetic bias current threshold is $IS_{j,tv}$; and if $IS_{j,t} < IS_{j,tv}$, determining that a value of a characteristic quantity $CS_{j,t}$ of the DC magnetic bias current of the transformer substation $BD_j$ at the time point t is 0, where $1 \le j \le M$ and $1 \le t \le T$; or if $IS_{j,t} \ge IS_{j,tv}$, determining that a value of a characteristic quantity $CS_{j,t}$ of the DC magnetic bias current of the transformer substation $BD_j$ at the time point t is 1, where $1 \le j \le M$ and $1 \le t \le T$.

D: Calculate a support degree and a confidence coefficient based on the calculated characteristic quantity of the feed current in step B and the calculated characteristic quantity of the DC magnetic bias current in step C, and generate a correlation rule. This step specifically includes:

generating an item set $P = \{p_1, p_2, \ldots, p_T\}$ within the measurement period T based on the calculated characteristic quantities of the feed current and the DC magnetic bias current, where each second corresponds to one item; there are a total of T items in the item set P; the item only includes a subway station and a transformer substation whose characteristic quantities are 1; and the time point t is used as an example, and if characteristic quantities of all the N subway stations and M transformer substations at the time point are 1, an item $p_t$ corresponding to the time point t shall include the N subway stations and the M transformer substations;

obtaining, from the item set and based on an Aprior algorithm, a frequent item set whose support degree and confidence coefficient are both greater than 80%; and generating a rule for a strong correlation between a subway station and a transformer substation based on the obtained frequent item set, and analyzing a correlation between the feed current in rail transit and the DC magnetic bias current of the transformer.

The technical solution in the present disclosure is described in detail below with reference to one specific embodiment.

Step A: Measure currents of feed cables of two subway stations and DC magnetic bias currents of five transformers in a survey region synchronously for 20 minutes by a clamp ammeter, where one value is recorded every one second.

Step B: Calculate characteristic quantities of the feed currents of the two subway stations ($DT_1$ and $DT_2$) within the measurement period.

Step C: Calculate characteristic quantities of the DC magnetic bias currents of five transformer substations ($BD_1$, $BD_2$, $BD_3$, $BD_4$, and $BD_5$) within the measurement period.

Step D: Generate an item set $P = \{p_1, p_2, \ldots, p_T\}$ within the measurement period T based on the calculated characteristic quantities of the feed currents in step B and the calculated characteristic quantities of the DC magnetic bias currents in step C. A time point t is used as an example. At the time point, only characteristic quantities of the subway station $DT_1$, the subway station $DT_2$, the transformer substation $BD_1$, and the transformer substation $BD_3$ are 1. Therefore, $p_t = \{DT_1, DT_2, BD_1, BD_3\}$. Similarly, an item set can be obtained for another time point.

Based on an Aprior algorithm, a frequent item set $F = \{DT_1, BD_1, BD_3\}$ whose support degree and confidence coefficient are both greater than 80% is obtained from the item set P. There are nonempty subsets $\{DT_1\}$, $\{BD_1\}$, $\{BD_3\}$, $\{DT_1, BD_1\}$, $\{DT_1, BD_3\}$, and $\{BD_1, BD_3\}$ in the frequent item set. Therefore, the following correlation rules can be generated. It can be seen that the following rules are strongly correlated.

| Rule | Confidence coefficient |
| --- | --- |
| $DT_1 \rightarrow BD_1, BD_3$ | 99% |
| $BD_1 \rightarrow DT_1, BD_3$ | 95% |
| $BD_3 \rightarrow DT_1, BD_1$ | 96% |
| $BD_1, BD_3 \rightarrow DT_1$ | 99% |
| $DT_1, BD_3 \rightarrow BD_1$ | 96% |
| $DT_1, BD_1 \rightarrow BD_3$ | 95% |

The above described are merely specific implementations of the present disclosure, but the protection scope of the present disclosure is not limited thereto. Any modification or replacement easily conceived by those skilled in the art within the technical scope of the present disclosure shall fall within the protection scope of the present disclosure.

The invention claimed is:

1. A method for analyzing a correlation between rail transit and direct current (DC) magnetic bias of a transformer, comprising the following steps:
   A: obtaining a current of a feed cable and a DC magnetic bias current: measuring the current of the feed cable in rail transit and the DC magnetic bias current of a transformer in a power grid within a certain period by a monitoring apparatus;
   B: calculating a characteristic quantity of the feed current within the measurement period based on the obtained current of the feed cable in step A;
   C: calculating a characteristic quantity of the DC magnetic bias current within the measurement period based on the DC magnetic bias current obtained in step A; and
   D: calculating a support degree and a confidence coefficient based on the calculated characteristic quantity of the feed current in step B and the calculated characteristic quantity of the DC magnetic bias current in step C, and generating a correlation rule.

2. The method for analyzing a correlation between rail transit and DC magnetic bias of a transformer according to claim 1, wherein in step B, the calculating a characteristic quantity of the feed current within the measurement period based on the obtained current of the feed cable in step A specifically comprises:
   assuming that there are a total of N subway stations, the measurement period is T, one measurement point is recorded every one second, a feed current of an $i^{th}$ subway station $DT_i$ at a time point t is $IF_{i,t}$, and a feed current threshold is $IF_{i,tv}$; and
   if $IF_{i,t} < IF_{i,tv}$, determining that a value of a characteristic quantity $CF_{i,t}$ of the feed current of the subway station $DT_i$ at the time point t is 0, wherein $1 \leq i \leq N$ and $1 \leq t \leq T$; or
   if $IF_{i,t} \geq IF_{i,tv}$, determining that a value of a characteristic quantity $CF_{i,t}$ of the feed current of the subway station $DT_i$ at the time point t is 1, wherein $1 \leq i \leq N$ and $1 \leq t \leq T$.

3. The method for analyzing a correlation between rail transit and DC magnetic bias of a transformer according to claim 2, wherein in step C, the calculating a characteristic quantity of the DC magnetic bias current within the measurement period based on the DC magnetic bias current obtained in step A specifically comprises:
   assuming that there are a total of M transformer substations, the measurement period is T, one measurement point is recorded every one second, a DC magnetic bias current of a $j^{th}$ transformer substation $BD_j$ at the time point t is $IS_{j,t}$, and a DC magnetic bias current threshold is $IS_{j,tv}$; and
   if $IS_{j,t} < IS_{j,tv}$, determining that a value of a characteristic quantity $CS_{j,t}$ of the DC magnetic bias current of the transformer substation $BD_j$ at the time point t is 0, wherein $1 \leq j \leq M$ and $1 \leq t \leq T$; or
   if $IS_{j,t} \geq IS_{j,tv}$, determining that a value of a characteristic quantity $CS_{j,t}$ of the DC magnetic bias current of the transformer substation $BD_j$ at the time point t is 1, wherein $1 \leq j \leq M$ and $1 \leq t \leq T$.

4. The method for analyzing a correlation between rail transit and DC magnetic bias of a transformer according to claim 3, wherein in step D, the calculating a support degree and a confidence coefficient based on the calculated characteristic quantity of the feed current in step B and the calculated characteristic quantity of the DC magnetic bias current in step C, and generating a correlation rule specifically comprises:
   generating an item set $P = \{p_1, p_2, \ldots, p_T\}$ within the measurement period T based on the calculated characteristic quantities of the feed current and the DC magnetic bias current, wherein each second corresponds to one item; there are a total of T items in the item set P; the item only comprises a subway station and a transformer substation whose characteristic quantities are 1; and the time point t is used as an example, and if characteristic quantities of all the N subway stations and M transformer substations at the time point are 1, an item $p_t$ corresponding to the time point t shall comprise the N subway stations and the M transformer substations;
   obtaining, from the item set and based on an Aprior algorithm, a frequent item set whose support degree and confidence coefficient are both greater than 80%; and
   generating a rule of a strong correlation between a subway station and a transformer substation based on the obtained frequent item set, and analyzing a correlation between the feed current in rail transit and the DC magnetic bias current of the transformer.

* * * * *